(12) United States Patent
Pisati et al.

(10) Patent No.: US 6,424,172 B1
(45) Date of Patent: Jul. 23, 2002

(54) CIRCUIT STRUCTURE FOR SYNTHESIZING TIME-CONTINUAL FILTERS

(75) Inventors: Valerio Pisati, Bosnasco; Salvatore Portaluri, Pavia; Marco Cazzaniga, Ispra; Rinaldo Castello, Arcore, all of (IT)

(73) Assignee: STMicroelectronics, S.r.l., Agrate Brianza (IT)

(*) Notice: Subject to any disclaimer, the term of this patent is extended or adjusted under 35 U.S.C. 154(b) by 0 days.

(21) Appl. No.: 09/796,996

(22) Filed: Feb. 28, 2001

(30) Foreign Application Priority Data

Feb. 29, 2000 (IT) ............................ MI00A0393

(51) Int. Cl.$^7$ ..................... H03K 19/082; H03K 19/173
(52) U.S. Cl. ........................ 326/48; 326/75; 327/52; 327/53; 327/478
(58) Field of Search ............... 326/48, 75; 327/52.53, 327/552, 478, 563, 103; 330/3, 252

(56) References Cited

U.S. PATENT DOCUMENTS

| | | | |
|---|---|---|---|
| 4,801,827 A | * | 1/1989 | Metz ........................... 327/280 |
| 5,081,423 A | * | 1/1992 | Koyama et al. ............ 327/341 |
| 5,614,860 A | * | 3/1997 | Osaki et al. ................ 327/552 |
| 6,239,653 B1 | * | 5/2001 | Rezzi et al. ................ 327/552 |
| 6,320,467 B1 | * | 11/2001 | Hallen ........................ 330/252 |

* cited by examiner

Primary Examiner—Michael G. Lee
Assistant Examiner—Steven S. Paik
(74) Attorney, Agent, or Firm—Lisa K. Jorgenson; David V. Carlson; Seed IP Law Group PLLC

(57) ABSTRACT

This invention relates to a circuit structure of the feedforward type with programmable zeroes, particularly for synthesizing time-continual filters. This structure comprises a pair of amplification cells interconnected at least one interconnection node and connected between a first signal input of a first cell and an output terminal of the second cell, each cell comprising a pair of transistors which have a conduction terminal in common and have the other conduction terminals coupled respectively to a first voltage reference through respective bias members. The structure further comprises a circuit leg connecting a node of the first cell to the output terminal and comprising a transistor which has a control terminal connected to the node of the first cell, a first conduction terminal connected to the output terminal, and a second conduction terminal coupled to a second voltage reference through a capacitor. Thus, a released "zero" can be introduced in the right semiplane of the pole-zero complex plane to improve the flattening of group gain.

7 Claims, 3 Drawing Sheets

CIRCUIT STRUCTURE FOR SYNTHESIZING TIME-CONTINUAL FILTERS

TECHNICAL FIELD

This invention relates to a feedforward type circuit structure with programmable zeroes for synthesizing time-continual filters, delay chains, and the like, which structure comprises a pair of amplification cells interconnected at at least one interconnection node and connected between a first signal input of a first of said cells and an output terminal of the second of said cells, each cell in the pair comprising a pair of transistors which have a conduction terminal in common and have the other conduction terminals coupled respectively to a first voltage reference through respective bias members.

Specifically, the invention relates to a circuit structure as above adapted to implement programmable delay cells having a broad pass-band and flat group delay. The description which follows will cover this specific field of application for convenience of illustration only.

BACKGROUND OF THE INVENTION

As is well known, the frequency response of an amplified electric signal bears a relation of amplitude, or modulo, to phase of the signal.

More particularly, as the band expands the phase changes, and the so-called group delay diminishes accordingly. Group delay is the derivative of phase with respect to frequency.

In theory, a programmable delay of infinite bandwidth would be ideal.

In practice, this cannot be achieved using prior art circuits. A programmable delay to meet an applicational requirement, and a sufficiently broad band, can be obtained at most.

Conventional circuits designed to fill the demand have used operational amplifiers, which require feedback control loops and filters of a high order, exhibit high power consumption, and occupy large circuit areas.

In conventional feedback circuit structures, the differentiated signals are input to high-frequency circuit nodes, introducing "zeroes" in the transfer function and giving rise to the above-noted drawbacks.

In an effort to obviate such drawbacks, a circuit structure has been proposed in the prior art which is of the feedforward type with programmable "zeroes". This prior structure can synthesize time-continual filters by expanding the signal band without appreciably distorting the group delay.

Such a structure is described in European Patent Application No. 97830696.7 by the Applicant, for example.

While in many ways advantageous and essentially achieving its objectives, the structure disclosed in the above patent application has first and second feedforward circuit legs which introduce a total of three "poles", and only one "zero", in the transfer function.

The greater the offset, the greater the delay obtained. That structure represents something of a frequency booster expanding the band.

This is achieved at the expense of some circuit complexity and enhanced power consumption.

SUMMARY OF THE INVENTION

According to principles of the present invention, a circuit structure of the feedforward type with programmable zeroes, particularly for synthesizing time-continual filters, delay chains and the like is provided. The structure has uniquely simple constructional and functional features effective to produce augmented group delay for a very moderate use of power, thereby overcoming the limitations of prior solutions.

One object of the invention is to provide a circuit structure of the feedforward type with programmable zeroes, for synthesizing time-continual filters, delay chains and the like, which is highly reliable in operation and relatively inexpensive to manufacture.

A feedforward type of circuit leg is connected to the first cell of the structure to the output terminal, the feedforward circuit leg being effective to introduce a "zero" in the right-hand semiplane of the pole-zero complex plane.

Based on this principle, the circuit has a circuit leg to connect a node of the first cell to said output terminal, said circuit leg comprising a transistor which has a control terminal connected to said node of the first cell, a first conduction terminal connected to said output terminal, and a second conduction terminal coupled to a second voltage reference through a capacitor.

The features and advantages of a circuit structure according to the invention will be apparent from the following description of an embodiment thereof, given by way of example and not of limitation with reference to the accompanying drawings.

DETAILED DESCRIPTION OF THE INVENTION

Figure 1:
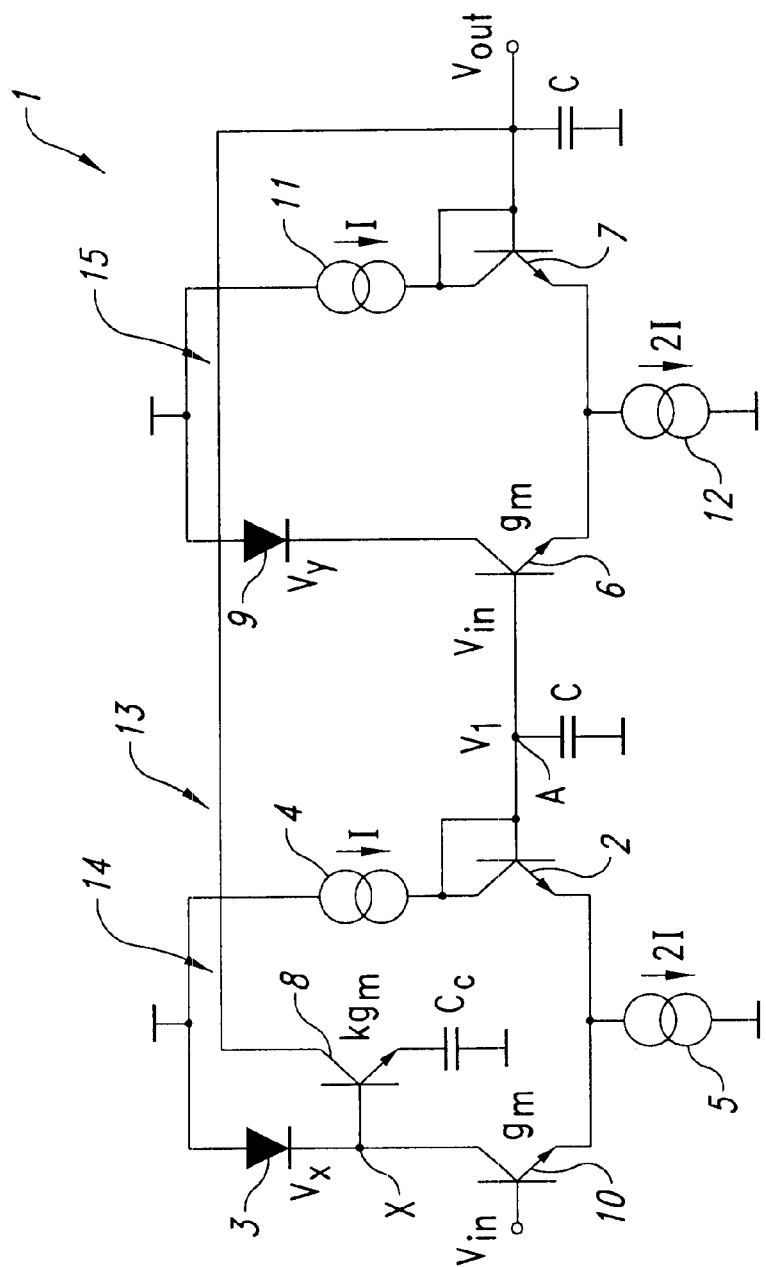
FIG. 1 shows schematically a circuit structure embodying this invention.

Referring to the drawings, in particular to the example of FIG. 1, a feedforward type of a circuit structure having programmable zeroes, for synthesizing time-continual filters, delay chains and the like, according to this invention, is shown generally at 1 in schematic form.

For example, the inventive structure can be used in a transverse filter to implement a Hilbert transform in the processing of data in PRML perpendicular recording read channels. Of course, other applications would be possible as well.

The structure 1 comprises a first circuit portion 14 and a second circuit portion 15 connected to each other. These portions are essentially amplification cells interconnected into a single-ended configuration.

The first portion, or cell, 14 comprises a first bipolar transistor 10 having a control or base terminal to receive an input signal Vin. This terminal represents the input terminal In of the circuit structure 1.

The first cell 14 further comprises a second bipolar transistor 2 having an emitter terminal connected to the emitter terminal of the first transistor. In essence, the transistors 10 and 2 have respectively at least one conduction terminal in common.

The first transistor 10 has the other conduction terminal, namely the collector terminal, coupled to a first supply voltage reference Vcc through a diode 3 which is forward biased to the power supply.

The second transistor 2 has its collector terminal coupled to said first supply voltage Vcc through a bias current generator which will deliver a current I.

The emitter terminals of the first 10 and second 2 transistors are coupled to a second voltage reference GND through a current generator 5 which will deliver a current 2I.

The base and collector terminals of the second transistor 2 are connected to each other.

A capacitor C is connected between the base terminal of the second transistor 2 and the second voltage GND.

The base terminal of the second transistor 2 also forms an interconnection node A between the first and the second cell of the circuit structure 1.

The second cell 15 is essentially identical with the first cell 14, and comprises a first bipolar transistor 6 whose base terminal is connected to the base terminal of the second transistor 2 in the first cell and presents a voltage V1.

The second cell further comprises a second bipolar transistor 7 having its emitter terminal connected to the emitter terminal of the first transistor 6.

The first transistor 6 has a collector terminal coupled to the first supply voltage reference Vcc through a diode 9 which is forward biased to the power supply.

The second transistor 7 has its collector terminal coupled to said first supply voltage Vcc through a bias current generator 11 which will deliver a current I.

The emitter terminals of the first 6 and second 7 transistors in the second cell are coupled to the second voltage reference GND through a current generator 12 which will deliver a current 2I.

The base and collector terminals of the second transistor 7 are connected to each other.

An additional capacitor C is connected between the base terminal of the second transistor 7 and the second voltage GND.

The base terminal of the second transistor 7 in the second cell is also an output terminal U of the circuit structure 1, from which output terminal the output signal Vout is obtained.

Advantageously in this invention, the circuit structure 1 further comprises a circuit leg 13 connecting a node X of the first cell to the output terminal U.

More particularly, the base terminal of a bipolar transistor 8 is connected to the collector X of the first transistor 10 of the first cell.

This bipolar transistor 8 has its collector connected directly to the output terminal U of the circuit structure 1.

Furthermore, the emitter terminal of the transistor 8 is connected to the second voltage reference GND through a capacitor Cc.

The value of the transconductance of the transistor 8 is given by the product k*$g_m$, where k is a design parameter and $g_m$ is the transconductance of the first transistor 10 in the first cell 14 and the first transistor 6 in the second cell 15.

All the transistors in the structure 1 are bipolar transistors of the npn type. A similar type of structure using pnp transistors by those of skill in the art could also be constructed and is considered equivalent.

The operation of the circuit structure 1 according to the invention will now be described.

The transfer function of the inventive circuit structure is given as:

$$H(s) = \frac{Vout}{Vin} = \frac{[kg_m^3 + s*g_m^2*Cc - 2*C*Cc*kg_m*s^2]}{[(kg_m + sCc)*(g_m + 2*s*C)^2]} \quad (1)$$

And if Cc=kcC is selected, with ωo=$g_m$/(2C), then (1) can be written as:

$$H(s) = \frac{Vout}{Vin} = \frac{[(1 + s*kc/(2k*\omega o)) - (kc*s^2)/(2*\omega o^2)]}{[(1 + s*kc/(2k*\omega o))*(1 + s/\omega o)^2]} \quad (2)$$

This transfer function produces a pair of real "zeroes", respectively lying in the right semiplane and the left semiplane of the complex plane pole-zero diagram.

As regards the "poles", the structure has two complex conjugate "poles" and one real "pole", all in the left semiplane.

Figure 3:
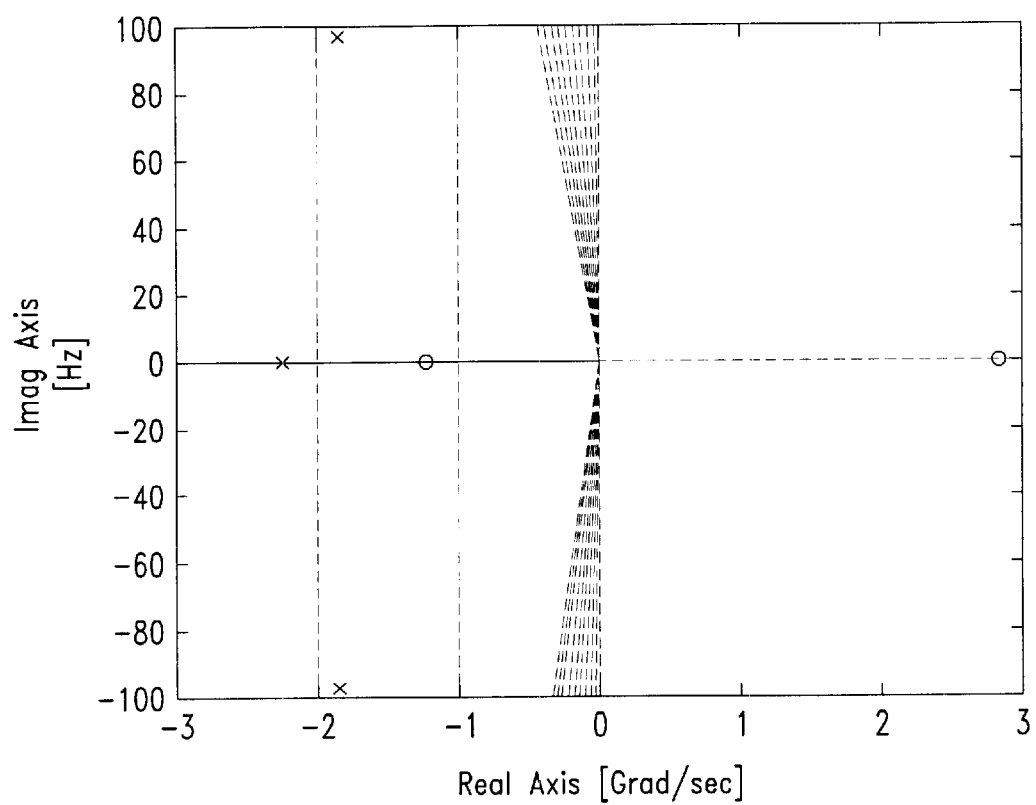
FIG. 3 shows schematically a two-dimensional pole-zero map having a real axis on the abscissa and an imaginary axis on the ordinate.

As can be seen in FIG. 3, the possibility afforded by the circuit structure according to the invention of having a "zero" on the left which lies symmetrically with respect to the "zero" on the right allows an offset to be obtained for the equivalent group delay having substantially four "poles".

By associating the capacitor Cc with the transistor 8, the position of the "zero" in the right semiplane can be released. It is as if the signal were further differentiated.

In other words, by modifying the capacitance of Cc, and hence the ratio k/Cc, the position of that "zero" can be changed.

Thus, a transfer function is obtained wherein the group delay is substantially flat for the signal band of interest, and is unaffected by the real "pole" located in the left semiplane.

As a practical example, the flatness of the group delay is maximized when the following set of values are used:

k=1.2;

kc=2;

ωo=2*π*300 MHz=1.88 Grad/sec with a group delay error of 1% at 132 MHz.

Figure 2A:
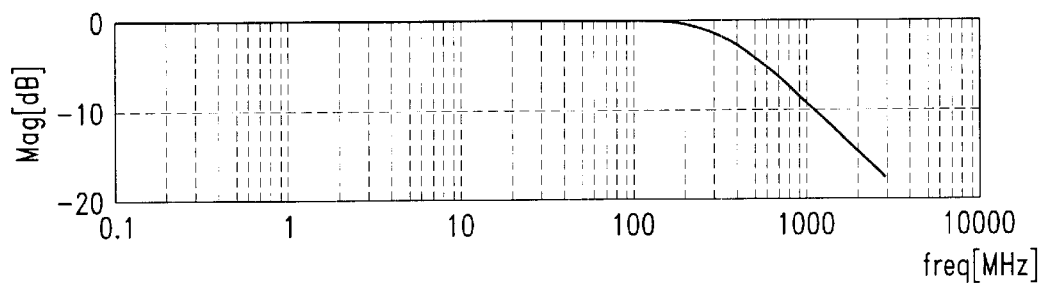
FIGS. 2A and 2B are plots of frequency response for the structure shown in FIG. 1.
Figure 2B:
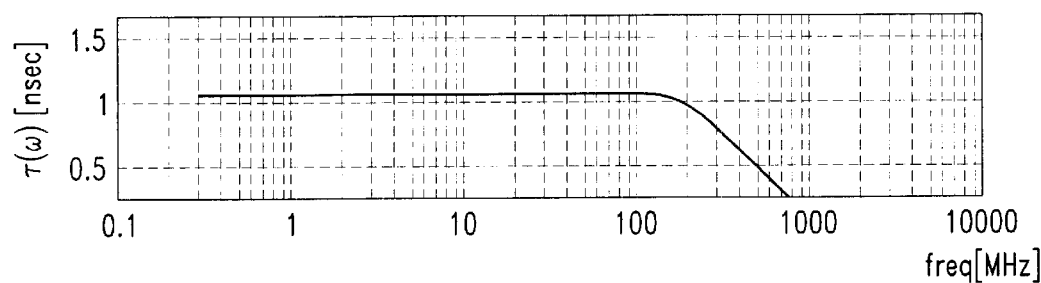

The graphs of FIGS. 2A and 2B have been plotted using these values.

The circuit structure of this invention is quite simple, and has proved capable of a very fast response.

Modifications and changes may be made unto the structure described hereinabove, within the invention scope as defined in the appended claims.

In particular, different capacitance values may be used for C in each cell, or the inventive structure could be embodied in CMOS technology by replacing each npn bipolar transistor with a corresponding N-channel MOS transistor.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit comprising:

a pair of amplification cells interconnected at at least one interconnection node and connected between a first signal input of the first of said cells and an output terminal of the second of said cells;

a pair of transistors within each cell which have a conduction terminal in common and have the other conduction terminals coupled respectively to a first voltage reference through respective bias members;

a circuit leg connecting a node of the first cell to said output terminal, said circuit leg having:

a transistor coupled to the circuit leg, the transistor having a control terminal connected to said node of the first cell, a first conduction terminal connected to said output terminal, and a second conduction terminal coupled to a second voltage reference through a capacitor.

2. The structure according to claim 1, wherein said transistor in the circuit leg is an npn bipolar transistor.

3. The structure according to claim 1, wherein said node is a conduction terminal of the first transistor of the first cell coupled to said first voltage reference.

4. The structure according to claim 1, wherein the capacitance value of said capacitor is related to the capacitance of a capacitor connected between the output terminal and said second voltage reference.

5. The structure according to claim 1, wherein the transconductance value of said transistor in the circuit leg is related to the transconductance of the first transistor in the first cell and of the first transistor in the second cell.

6. The structure according to claim 1, wherein said transistor in the circuit leg is a bipolar transistor, and that the conduction terminal connected to the output terminal is the collector.

7. The structure according to claim 5, wherein said relationship of the transconductance value of said transistor in the circuit leg to the transconductance of the first transistor in the first cell and of the first transistor in the second cell is a multiply parameter k.

* * * * *